United States Patent
Zink et al.

(10) Patent No.: US 6,359,822 B1
(45) Date of Patent: Mar. 19, 2002

(54) SERIAL ACCESS INTEGRATED CIRCUIT MEMORY

(75) Inventors: Sébastien Zink, Aix en Provence; Bertrand Bertrand, Trets; David Naura, Aix en Provence, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/676,744

(22) Filed: Sep. 29, 2000

(30) Foreign Application Priority Data

Sep. 29, 1999 (FR) .......................................... 99 12150

(51) Int. Cl.$^7$ ................................................ G11C 7/00
(52) U.S. Cl. ............. 365/221; 365/189.12; 365/230.06; 365/189.05
(58) Field of Search ...................... 365/185.33, 189.12, 365/189.05, 221, 189.04, 230.06

(56) References Cited

U.S. PATENT DOCUMENTS

| | | | |
|---|---|---|---|
| 5,260,905 A | | 11/1993 | Mori |
| 5,513,334 A | | 4/1996 | Alexander |
| 5,568,424 A | * | 10/1996 | Cernea et al. ......... 365/185.33 |
| 5,877,780 A | * | 3/1999 | Lu et al. ..................... 345/519 |
| 5,905,673 A | * | 5/1999 | Khan ..................... 365/185.03 |
| 6,034,891 A | * | 3/2000 | Norman ................. 365/185.09 |

FOREIGN PATENT DOCUMENTS

| | | |
|---|---|---|
| EP | 0 317 984 | 5/1989 |
| WO | WO 96/24135 | 8/1996 |

OTHER PUBLICATIONS

French Search Report dated Jun. 28, 2000 with Annex to French Application No. 99–12150.

* cited by examiner

*Primary Examiner*—David Nelms
*Assistant Examiner*—Thong Le
(74) *Attorney, Agent, or Firm*—Lisa K. Jorgenson; Jose Gutman; Fleit, Kain, Gibbons, Gutman & Bongini P.L.

(57) ABSTRACT

An integrated circuit serial access type memory, notably in EEPROM technology, includes a data input (DI) and a data output (DO), a defined memory plane (MM) organized in memory words, as well as a set (LAT) of column registers, one such register being associated with at least one memory word of the memory. The memory includes a writing circuit and/or a reading circuit. The writing circuit operates, during an operation for writing a binary word in a given memory word (M0–M7), for loading the binary data of the binary word received in series at the data input (DI) directly into respective storage and switching latches (HV0–HV7) of the column register (R1) associated with the memory word (M0–M7). The reading circuit operates, during an operation for reading a binary word in a memory word, for reading successively the binary data stored in the memory cells of the memory word and for delivering directly, in serial form, each binary data read to the data output (DO) of the memory.

19 Claims, 5 Drawing Sheets

SERIAL ACCESS INTEGRATED CIRCUIT MEMORY

CROSS-REFERENCE TO RELATED APPLICATIONS

This application is based upon and claims priority from prior French Patent Application No. 99-12150, filed Sep. 29, 1999, the entire disclosure of which is herein incorporated by reference.

BACKGROUND OF THE INVENTION

1. Field of the Invention

The present invention generally relates to electronic memory devices, and more particularly to a serial access type integrated circuit memory, for instance in EEPROM (electrically erasable and programmable read-only memory) or EPROM Flash technology.

2. Description of the Prior Art

The architecture of a serial access memory such as known in the state of the art is depicted schematically in FIG. 1.

The memory first of all comprises a memory plane MM as such. The memory plane is comprised of a matrix of memory cells constructed according to a given technology. A memory cell memorizes the value of one bit of the memory. The cells belonging to a same column are connected to a same connection line, classically depicted vertically and referred to as a bit line. Further, the cells belonging to a same line are connected to a same connection line, classically depicted horizontally and referred to as a word line.

In EEPROM technology, the memory plane is organized in memory words. A memory word designates a certain number of adjacent memory cells on a same line of the memory (for example eight such cells). Such a memory word memorizes eight binary data that form a binary word. A memory word thus memorizes one byte of the memory. In general, at least eight binary data are written into or read from the memory simultaneously, so forming a binary word. In certain cases, the writing is carried out simultaneously in several memory words of a same line of the memory, or even in all the memory words of that line. This is then referred to as page mode writing. In what follows, the term "word" shall be used in isolation to designate sometimes a binary word, sometimes a memory word, depending on the context.

The memory also comprises a line decoder circuit ROWDEC and a column decoder circuit COLDEC, as well as a set of column registers LAT. Each column register is associated to at least one memory word of the memory. When the memory comprises several lines of cells, a column register is in general associated to the memory words of each vertically adjacent line. It comprises eight latches, in which eight data are respectively loaded in view of writing in the associated memory word.

For writing or reading of a binary word in the memory, an instruction is received at a data input DI of the memory in accordance with a given serial transmission protocol (for instance the I²C, SPI or MICROWIRE protocol). Because the binary data of the instruction are sent in the form of an electrical signal, they are in general first of all reshaped by means of an input buffer circuit INBUF. Such a circuit is not obligatory and can be omitted in certain applications. In general, the following information is contained in the instruction: an operating code (e.g. writing or reading), a memory address designating a memory word, and at least one word of data to be written as the case arises (for a write operation). A sequencer SEQ generates command signals adapted to manage the memory appropriately when executing a received instruction. The sequencer SEQ receives a clock signal CLK on a clock input of the memory. The command signals it generates are shown by arrows in broken lines.

Hence the data corresponding to the address of the memory word concerned by the operation are loaded into an address register AREG under control of a sequencer SEQ. From there, a part $x_i$ of the memory word address, designated column address, is supplied as an input to the column decoder circuit COLDEC. The latter serves to select the column register associated with the memory word concerned. Another part $y_j$ of the memory word address, designated line address, is supplied as an input to the line decoder ROWDEC. The latter serves to select the memory line of the memory word concerned.

Likewise, the data of the instruction corresponding to the data word to be written (as the case arises) are loaded into a first input shift register DREGA under control of the sequencer SEQ. Register DREGA is an eight-bit register, i.e., it comprises eight storage latches in series respectively for memorizing eight consecutively received data. Each latch comprises a non-inverting output which delivers the binary data received at the input, and an inverting output which delivers the inverse binary data relative to the data received at the input. These latches are connected in series via their non-inverting outputs. The shift register DREGA ensures the series-to-parallel conversion of the flow of binary words received by the memory via the input DI. Indeed, the inverting outputs of the eight latches of register DREGA are connected to a data input bus INPUT_DATA_BUS formed by an array of eight respective lines. Bus INPUT_DATA_BUS is also connected to a set of column latches LAT to supply the latter, in parallel form, with eight binary data bits which are the inverse binary bits of the binary data received at the data input DI. These binary data are loaded into storage and switching latches of the column register associated to the memory word concerned under control of the sequencer SEQ. Writing a binary word in an EEPROM technology memory comprises a step of simultaneously erasing all the cells of the memory word (so that they store binary data 1), followed by a step of conditional programming implemented for all the cells of the memory word (such that only the thus conditionally programmed cells store the binary data 0). The erasure and programming of a memory cell in EEPROM technology takes place through the tunnel ("Fowler-Nordheim") effect. To this end, a high programming or erasure voltage VPP, on the order of 18 volts, is generated by a generator circuit HVS from the memory supply voltage VCC, which is on the order of 5 volts. The generator circuit HVS is connected to an input terminal Vcc of the memory. This can be a charge pump or a so-called "Schenkel" circuit. The high voltage VPP is supplied as an input both to the set LAT and to the ROWDEC circuit.

An operation for reading out a binary word in a given memory word of the memory plane MM calls for a readout circuit SENSE_AMP. Such a circuit comprises eight amplifiers connected, via a readout bus READ_BUS formed by an array of eight lines, respectively to eight storage and switching latches of the column register associated to the memory word concerned. Circuit SENSE_AMP delivers binary data 1 or 0 as a function of whether or not a current is detected in the bit lines concerned of the memory.

The binary data at the output of readout circuit SENSE_AMP are sent in parallel to a second output shift register DREGB via a data bus OUTPUT_DATA_BUS. Shift register DREGB provides a parallel/series conversion of the binary data read in the memory so as to deliver these data in serial form at a data output terminal DO. To this end, the output of the shift register DREGB is connected to output terminal DO via an output buffer circuit OUTBUF. The function of circuit OUTBUF is essentially to amplify an electrical signal carrying the read data and delivered by the terminal DO. Such a circuit is not obligatory however, and can be omitted in certain applications.

One drawback with serial access memories of known architecture is that the first and second shift registers, respectively DREGA and DREGB take up a lot of space on the doped silicon substrate on which the memory is formed. This is due to the large number of transistors that compose them. It will be understood that this area occupied by the shift registers is penalizing in terms of manufacturing costs, especially for low-capacity memories (with few stored bytes).

Accordingly, there exists a need for overcoming the disadvantages of the prior art as discussed above.

SUMMARY OF THE INVENTION

According to a preferred embodiment of the present invention, a preferred implementation will remedy the drawbacks of prior art memories as discussed above. In view of the foregoing, a preferred embodiment of the present invention proposes an integrated circuit serial access type memory, notably in EEPROM technology, comprising a data input and a data output, a memory plane organized in memory words, as well as a set of column registers, one such register being associated with at least one memory word of the memory, first means operative, during an operation for writing a binary word in a given memory word, for loading the binary data of the binary word received in series at the data input directly into respective storage and switching latches of the column register associated with the memory word and/or second means operative, during an operation for reading a binary word in a memory word, for reading successively the binary data stored in the memory cells of the memory word and for delivering directly, in serial form, each binary data read to the data output of the memory.

The term "directly" is to be understood as meaning that the memory according to the invention does not comprise any input shift register and/or output shift register. Nevertheless, it can still comprise an input buffer circuit and/or an output buffer circuit depending on application requirements. In other words, this term means that the data do not undergo a series-to-parallel conversion at the input nor a parallel-to-series conversion at the output. By virtue of the absence of an input shift register and/or an output shift register, the resulting memory occupies a reduced silicon area.

BRIEF DESCRIPTION OF THE DRAWINGS

Other characteristics and advantages of the invention shall become apparent upon reading the following description. The latter is purely illustrative and is to be read in conjunction with the appended drawings in which.

DESCRIPTION OF THE PREFERRED EMBODIMENTS

For implementing the conditional programming step for a write operation in the memory, the memory generally comprises a storage and switching latch for each bit line. A column register comprises eight such latches to allow simultaneous writing into all the cells of a same memory word, and even into all the memory words of a same memory line (in the page mode). Such a latch has a double function. Firstly, it enables provisional storage of a binary data in view of writing in a cell. Secondly, it enables the bit line to which the cell is connected to be brought to the voltage VPP, if the binary data to be written is zero, so causing the cell to be programmed. This second function of the latch is referred to as conditional switching.

Figure 2:
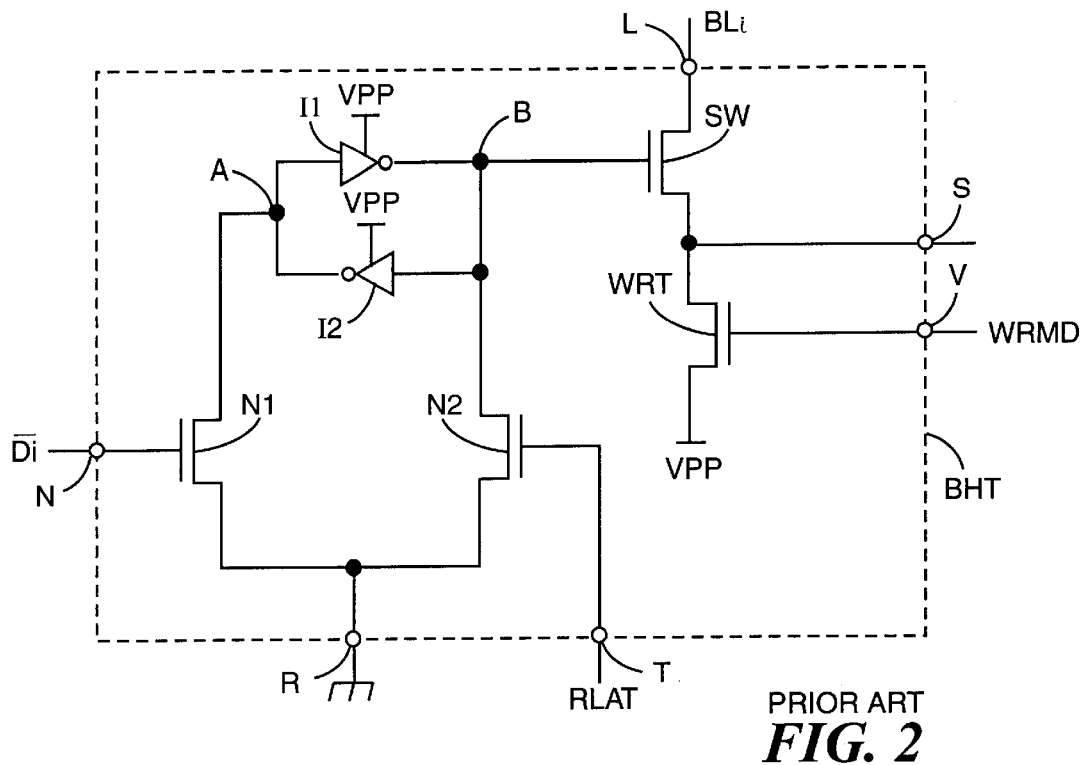
FIG. 2 is a diagram of a storage and switching latch of a column register known from the prior art.

FIG. 2 is a diagram showing a storage and switching latch as known in the state of the art.

The latch BHT shown in FIG. 2 first of all comprises high-voltage storage means for temporarily storing a binary data 1 or 0 respectively in the form of a high voltage VPP or a zero voltage.

These means classically comprise two inverters 11 and 12 connected "head-to-tail" between a node A and a node B so as to produce a storage effect. These are high-voltage inverters, i.e. they can receive and deliver a voltage equal to either zero or VPP. They are classically CMOS technology inverters, i.e. they comprise a P-type MOS transistor and an N-type MOS transistor in series between VPP and ground, the gates of the two transistors being connected together and the output of the inverter being taken from the node corresponding to the common source of the two transistors. By convention, the output of the storage means is taken from node B. In other words, the binary data stored by the latch is 0 when node B is brought to zero voltage (ground potential) and is 1 when node B is brought to VPP voltage (potential with reference to ground).

Latch BHT also comprises loading means for loading a binary data in the high-voltage storage means.

These storage means firstly comprise an N-type MOS transistor designated N1 connected to node A by its drain and to an input R of the latch by its source. In operation, the input R is connected to ground via a selection transistor (not shown). The gate of transistor N1 receives a data signal Di bar, which is a low-voltage signal (i.e. whose level is either zero or equal to VCC) representing the inverse of the binary data to be written. In other words, the level of signal Di bar is zero if the binary data to be written is 1 and is equal to VCC if the binary data to be written is 0. When its level is equal to VCC, the signal Di bar enables node B to be brought to the VPP voltage, so loading the binary value 1 in the high-voltage storage means I1, I2.

The loading means secondly comprise another N-type MOS transistor designated N2, connected to node B by its drain and to the input R by its source. It is recalled that in operation, input R is connected to ground via a selection transistor (not shown). The gate of transistor N2 is connected to an input T of the latch to receive a reset-to-zero signal RLAT which is also a low-voltage signal. When its level is equal to VCC, this signal enables node B to be brought to ground potential, so loading the binary value 0 into the storage means I1, I2.

The loading of a binary data into the storage means I1, I2 is carried out in two stages: at a first stage, signal RLAT passes to VCC, thus connecting node B to ground via transistor N2 which is conducting, so that a 0 is loaded into the storage means I1, I2; signal RLAT then returns to 0 volts to block transistor N2; at a second stage, the inverse of the binary data to be written is brought to the gate of transistor N1 by means of the signal Di bar, so that node A is brought to ground potential through transistor N1 only when the binary data to be written is 0, which has the effect of loading the binary value 1 into the storage means I1, I2.

Latch BHT further comprises conditional switching means to bring to voltage VPP—or not to do so—the bit line Bli connected to an output L of the cell as a function of the value stored by the high-voltage storage means.

These conditional switching means comprise an N-type transistor designated SW connected to the output of the high-voltage storage means I1, I2 (i.e. to node B) by its gate, to an input L of the latch by its source, the bit line Bli being connected to that input L, and by its drain to the high-voltage VPP supply source via an N-type MOS transistor designated WRT. Transistor WRT receives at its gate a signal WRMD applied to an input V of the latch, making it conducting during the write operations in the memory (i.e. in the write mode) and which blocks it during memory readout (i.e. in the read mode). Transistor WRT therefore serves to isolate the bit line Bli from the high voltage VPP in the readout mode. In the write mode, transistor SW provides the conditional switching function of the low-voltage latch since it enables the bit line Bli to be brought to the high voltage VPP only when the binary value stored in the storage means I1, I2 is 1, i.e. when the binary data to be written is 0.

The drain of transistor SW is connected to an output S of the latch so that the input L—and thus bit line Bli—are connected to that output S when this transistor is conducting.

Figure 3:
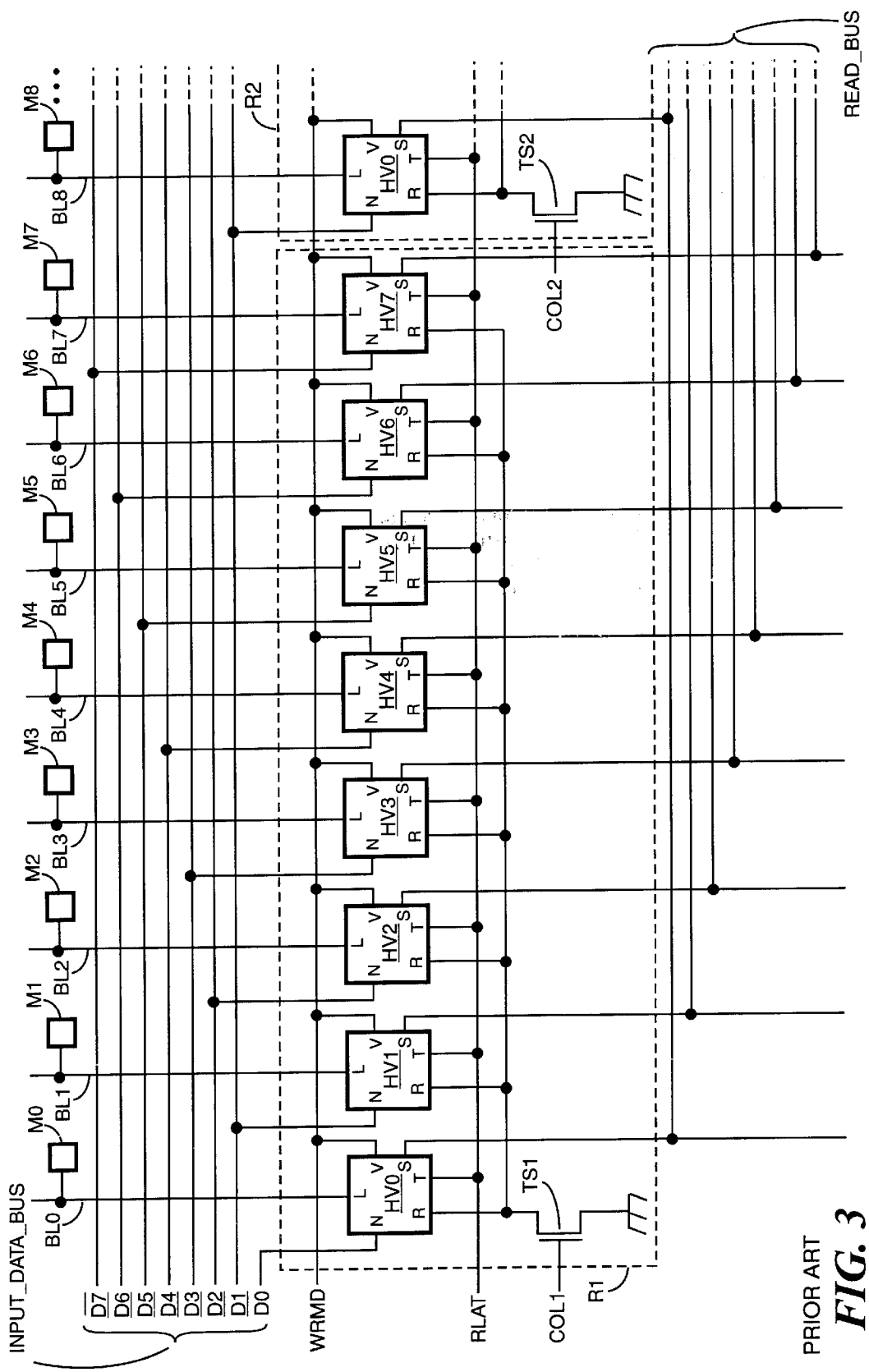
FIG. 3 is a diagram of a prior art column register.

FIG. 3 shows a column register according to the prior art. This register R1 is associated to a memory word formed of memory cells M0 to M7, as well as, optionally, to other memory words (not shown) vertically adjacent to the latter. Memory cells M0 to M7 are connected to bit lines respectively BL0 to BL7. The memory word comprising eight cells, register R1 comprises eight storage and switching latches HV0 to HV7. These cells are of the type described with respect to FIG. 2. They are connected by their input L to bit lines respectively BL0 to BL7. They are connected by their input N to the data input bus INPUT_DATA_BUS to receive, during a write operation, data signals respectively D0 bar to D7 bar which carry the data inverse to the data to be written in the memory word. They are connected by their output S to a readout bus READ_BUS to deliver the data read out from the memory cells respectively M0 to M7 during a readout operation. They receive at their V input a same signal WRMD. They receive at their T input a same signal RLAT.

Figure 1:
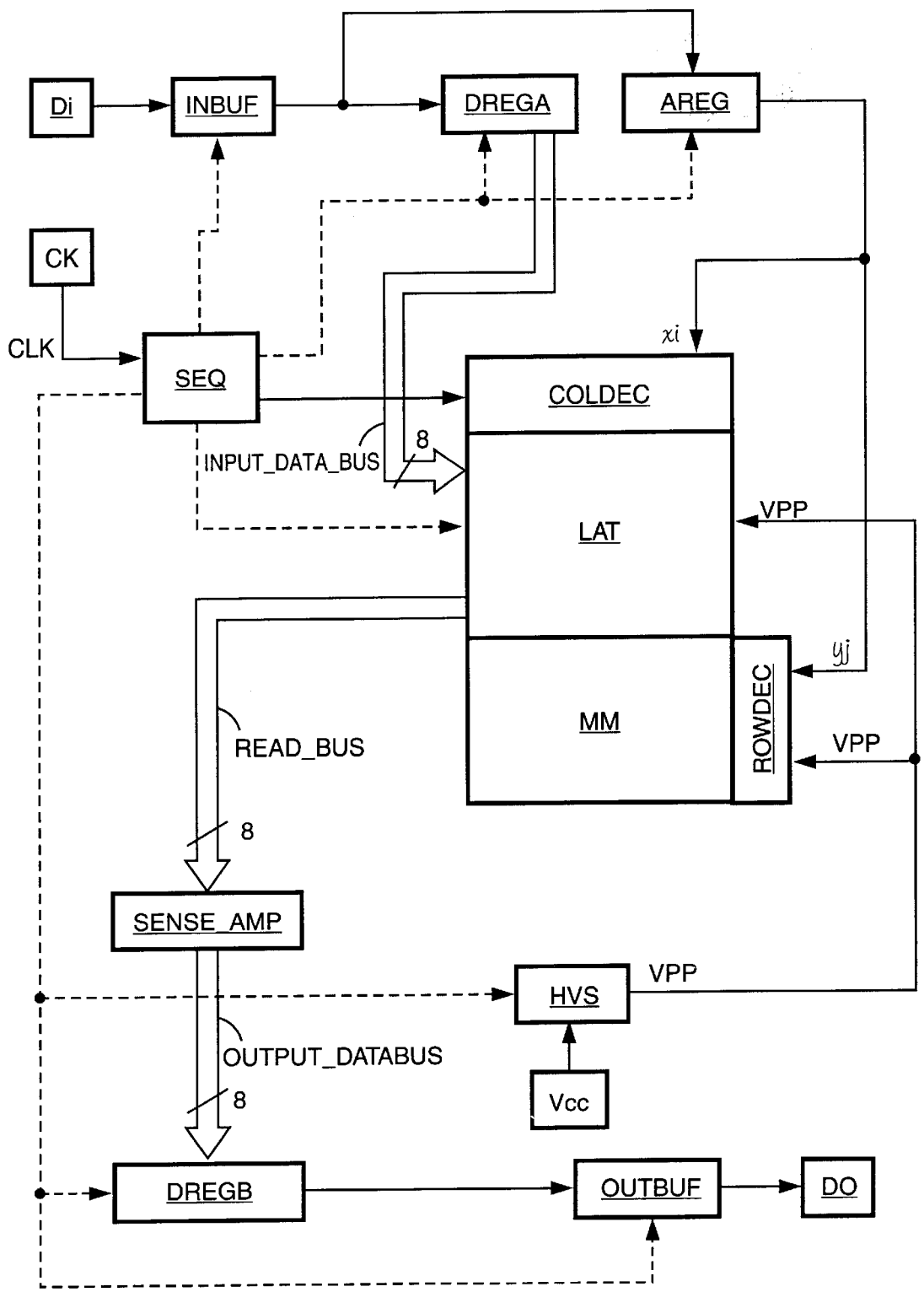
FIG. 1, already described above, is a diagram of a prior art serial access memory.

Register R1 finally comprises a selection transistor TS1 connected by its drain to the input R of each latch HV0 to HV7 and by its source to ground. This selection transistor TS1 receives at its gate a column register selection signal COL1 which is generated by circuit COLDEC (FIG. 1).

The figure also partially shows another register R2 associated to a memory word horizontally adjacent to the memory word M0–M7, of which only the first cell M8 can be seen. This register R2 is connected in the same way as register R1 to the data input bus INPUT_DATA_BUS and to the readout bus READ_BUS. Its storage and switching latches, of which only the one designated HV0 is shown in the figure, also receive the WRMD and RLAT signals at their respective inputs V and T. Moreover, it comprises a selection transistor TS2 connected by its drain to the output R of the storage and switching latches and by its source to ground, and which receives a second selection signal COL2 at its gate.

The operation of the registers is as follows.

During a write operation in the memory word M0–M7, signal COL1 passes to 1 to connect the inputs R of the latches HV0 to HV7 of register R1 to ground. This is referred to as selecting the register R1. Next, the data inverse to the data to be written are loaded into the high-voltage storage means of latches HV0 to HV7 of register R1 via the RLAT signals at a first stage, and the data signals D0 bar to D7 bar at a second stage. Signal WRMD then passes to 1 to connect the bit lines BL0 to BL7 respectively to the high programming voltage VPP as a function of the ON or OFF states of transistor SW of latches HV0 to HV7 respectively.

During a readout operation of the memory word M0–M7, the signal COLL passes to 1 to select register R1. Signal WRMD remains at zero to isolate the bit lines BL0 to BL7 from the high voltage VPP. Moreover, when appropriate command signals are applied to the memory cells M0 to M7, a current passes or not on the bit lines BL0 to BL7, i.e. also along the eight lines of the readout bus READ_BUS connected to the output S of latches HV0 to HV7 respectively, as a function of the programmed or erased state of the memory cells M0 to M7 respectively. The readout circuit SENSE_AMP, which comprises eight respective readout amplifiers, then delivers the data read on the data output bus OUTPUT_DATA_BUS.

As will have been understood, the writing or readout operations in the memory word comprising cell M8 are conducted in the same manner, except for the fact that it is then the signal COL2 instead of COL1 which passes to 1to select the register R2 instead of register R1.

Figure 4:
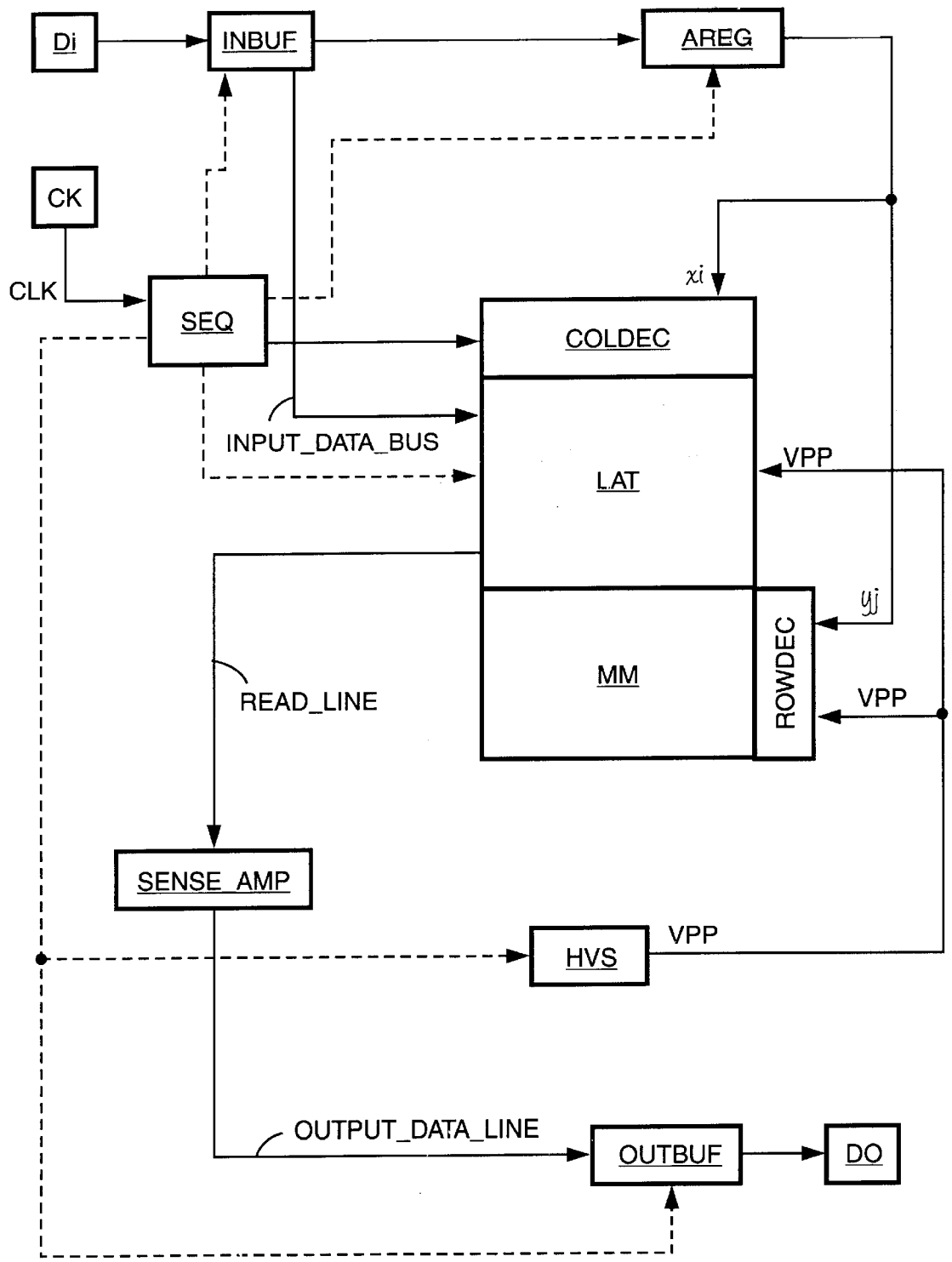
FIG. 4 is a diagram of serial access memory in accordance with the invention.

FIG. 4 shows a diagram of a memory in accordance with the invention. In the figure, the same elements as in FIG. 1 carry the same references. Only the differences shall be described in what follows.

The data received in series via input terminal DI are no longer sent to a shift register, but are loaded directly into the respective storage and switching latches of one of the column registers of the set LAT, namely the register associated to the memory word in which they are to be written. This is the reason why the memory in accordance with the invention comprises no input shift register such as register DREGA of FIG. 1, nor a data bus such bus INPUT_DATA_BUS of FIG. 1. Instead, it comprises means including a single input data line INPUT_DATA_LINE directly connecting the data input Di to the set LAT of column registers via the input buffer circuit INBUF. In other words, the memory according to the invention comprises first means operative during an operation of writing a binary word in a given memory word for loading the binary data of a binary word received in series on the data input DI directly into respective storage and switching latches of the column register associated to the memory word in which that binary word is to be written.

It is recalled that within the meaning of the invention, the adverb "directly" signifies that the data are not loaded into an intermediate shift register.

Moreover, the memory in accordance with the invention comprises no output shift register such as register DREGB, nor an output data bus such as OUTPUT_DATA_BUS. Instead, it comprises means operative during a readout operation of a binary word in a memory word, to read successively the binary data stored in the memory cells of the memory word and to deliver directly, in serial form, each binary data read to the data output DO of the memory via, as the case arises, a buffer circuit at the most. In particular, it comprises a single line OUTPUT_DATA_LINE connecting the set LAT of column registers to the data output D0 via the output buffer circuit OUTBUF. Thus, another difference with the memory in accordance with the invention is that the readout circuit SENSE_AMP of FIG. 4 comprises a single readout amplifier instead of the eight comprised in that of FIG. 1. This is also an advantage of the invention since this readout circuit of the memory in accordance with the invention is accordingly smaller than that of a memory according to the prior art.

Figure 6:
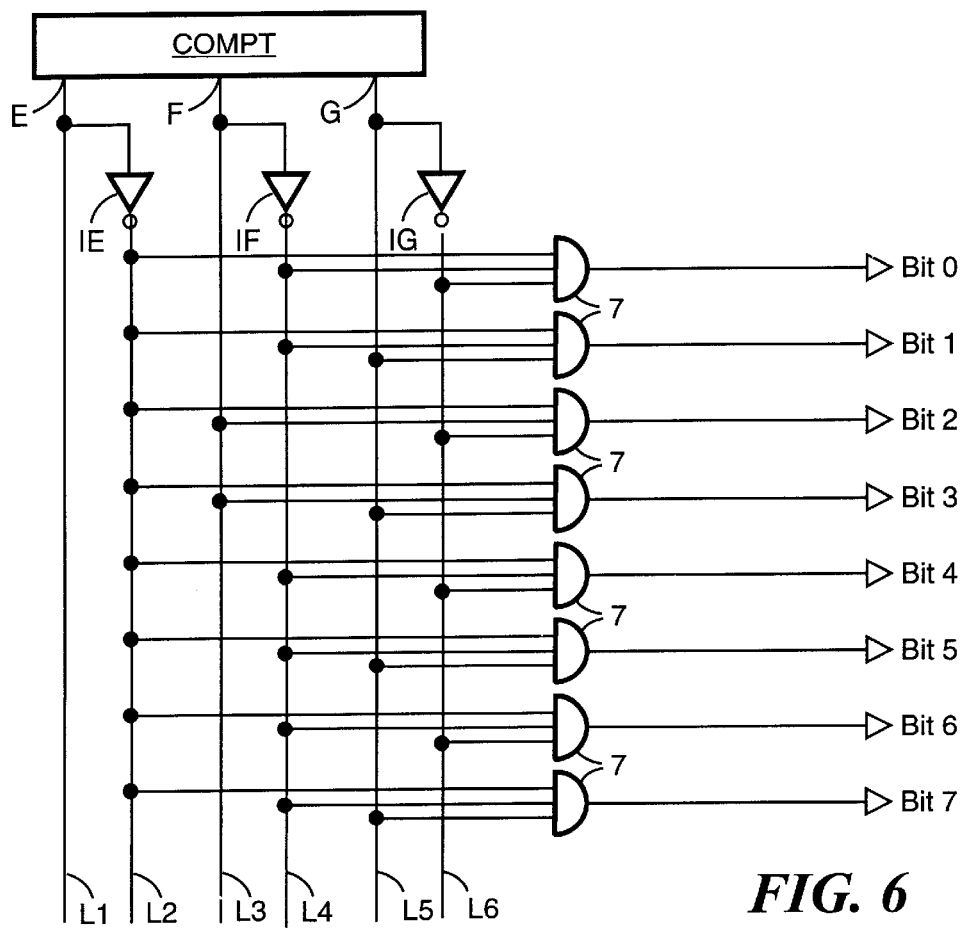
FIG. 6 is a diagram of some of the means of memory according to the invention.
Figure 5:
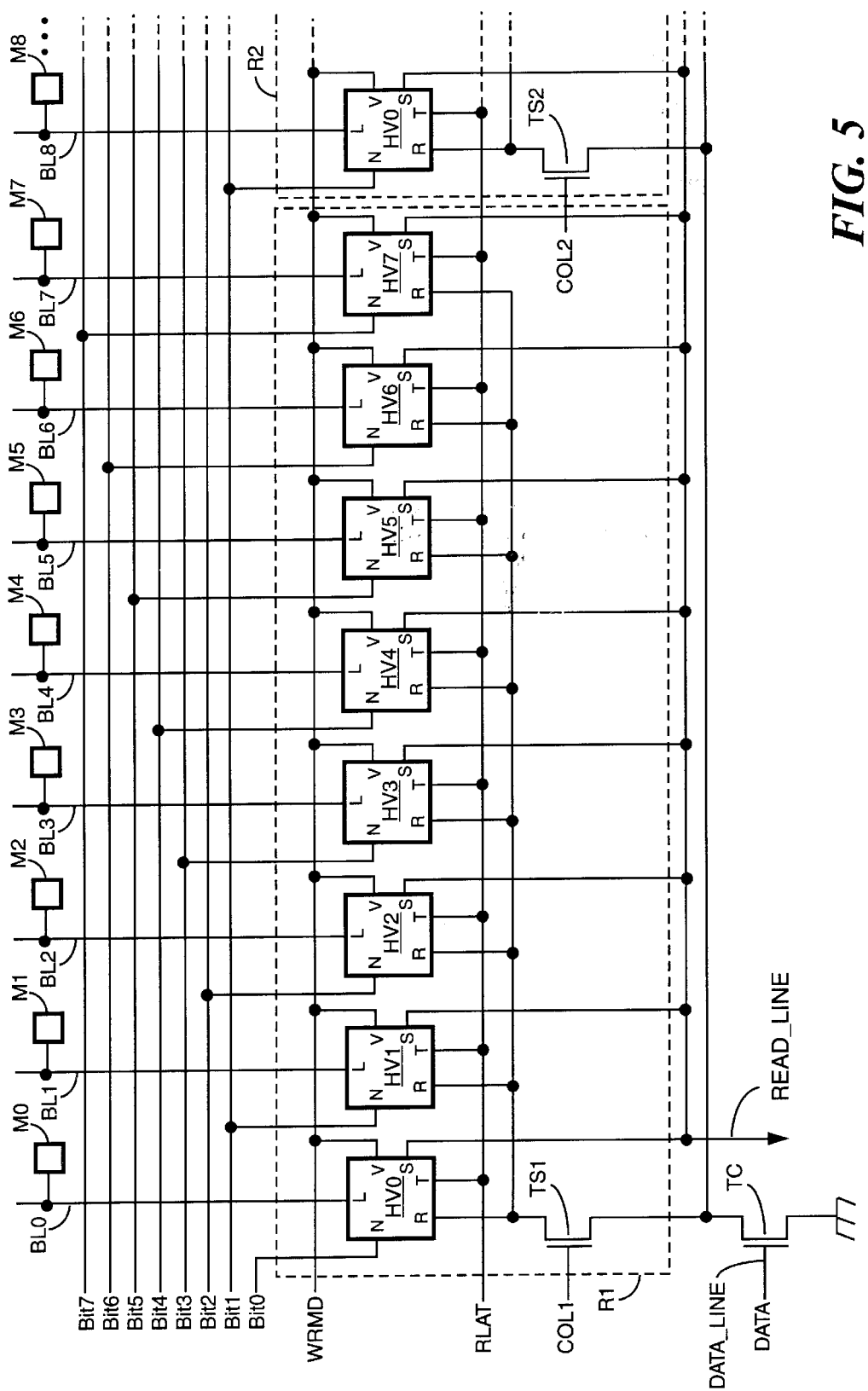
FIG. 5 is a diagram of a column register in accordance with the invention.

Other details of the first and second means in accordance with the invention shall become apparent from reading the description in respect of FIG. 5 and FIG. 6.

FIG. 5 is a diagram showing a column register in accordance with the invention. In this figure, the same elements as in FIG. 3 carry the same references. Only the differences shall be described in what follows.

Structurally, the column register R1 is identical in the memory in accordance with the invention and in the memory according to the prior art. However, register R1 in accordance with the invention is connected to the remainder of the memory in a different manner.

According to a first characteristic of the invention, the inputs N of the latches, i.e. the gates of transistors N1 as well, receive latch selection signals, respectively Bit0 to Bit7. Only one of those signals can be 1 at a time, the others being necessarily at 0. Note that the storage means of each cell are reset to zero, by a transition to 1 of the reset to zero signal RLAT, after each transition to 1 of one of the latch selection signals. In this way, only one latch at the most is selected at each instant. In accordance with the teachings of the invention, this selection is effected via the latch loading means. An example of means for generating the selection signals Bit0 to Bit7 shall be described further with reference to FIG. 6. Expressed in more functional terms, the means of the invention comprise means for applying latch selection signals on the means for loading the storage and switching latches of the column registers.

According to a second characteristic of the invention, the source of selection transistor TS1 of the column registers such as register R1 is not connected directly to ground. To the contrary, it is connected to ground via a loading transistor TC. The latter does form part of a particular column register, but is common to all the registers R1, R2, etc. of the memory. Its gate is connected to the data input line INPUT_DATA_LINE of the memory to receive a data signal DATA bar which, in the write mode, carries the data inverse to the data to be programmed. In this way, the binary data 0 is loaded into the storage means of a given latch HV0 to HV7 of the column register when: firstly the Bit0 to Bit7 selection signal at the input N of the said latch is at 1, secondly when the signal DATA bar is at 1, i.e. when the binary data to be written is at 0, and thirdly when the column register selection signal COL1 is at 1, these three conditions being cumulative. In fact, the signal DATA bar and the loading transistor TC cooperate with the register selection means formed of selection transistors TS1, TS2, . . . of the column registers respectively R1, R2, . . . They cooperate for the loading of a data in the one of the latches of the column register selected by the register selection signals COL1, COL2, . . . , which is selected by the latch selection signals Bit0 to Bit7. In more functional terms, the means of the invention comprise means for loading data in the storage means of the selected latch, which act via the register selection means formed by the register selection transistors.

Note that these means in accordance with the invention are common to all the latches of a column register as well as—as the case arises—all the column registers of the memory. This is what makes it possible to have just one single data input line INPUT_DATA_LINE to lead in series eight items of data to the eight latches of a same column register, successively selected by the signals Bit0 to Bit7.

According to another characteristic of the invention, the outputs S of each column register are connected to one and only one readout line, namely the readout line READ_LINE shown in FIG. 4.

For the readout operation of a given memory word, the operation of the memory in accordance with the invention is as follows. First of all, the signal WRMD passes to 0, so as to isolate the bit lines from the high-voltage source VPP. In addition, line DATA_LINE is forced to 1 by appropriate means, so that the signal DATA bar is at 1 to allow the source of the selection transistor of each register to be connected to ground. Next, the column selection register associated to the memory word in which a binary word is to be read, for example R1, is selected by the fact that register selection signal COL1 passes to 1. Finally, the latch selection signals Bit0 to Bit7 successively select each of the latches HV0 to HV7, passing successively to 1 to load the binary value 1 into the storage means of each latch successively. Note that the storage means of each latch are reset to zero by the transition to 1 of the reset-to-zero signal RLAT after each transition to 1 of one of the latch selection signals. In this way, only one latch at the most is selected at each instant. Accordingly, each time a latch of the selected register is selected, the logic value of the data stored in the associated memory cell is detectable by detecting a current on the readout line READ_LINE. This detection is carried out as explained above by means of one single readout amplifier of the readout circuit SENSE_AMP of FIG. 4.

FIG. 6 shows an embodiment of means for generating the aforementioned latch selection signals Bit0 to Bit7.

These means comprise a 3-bit counter designated COMPT. Such a counter can count from zero to seven in binary values. These binary values are delivered on three outputs E, F and G of counter COMPT. Each of them is connected directly to a line L1, L3 and L5 respectively and to a line L2, L4, L6 respectively via a respective inverter IE, IF and IG. Eight three-input AND type logic gates, globally identified by reference 7, are connected to each of three lines L1 to L6 in a known manner, so that the output of each of these eight logic gates generates one and only one of eight logic combinations of the three outputs E, F and G of the counter COMPT, and a logic 1 passes along the outputs of the logic gates 7 when the counter counts from zero to seven. As shall have been understood, the signals Bit0 to Bit7 are delivered by the outputs of logic gates 7.

According to one advantage of the invention, the memory comprises no input shift register, nor—as the case arises—an output shift register.

According to another advantage, the data input bus of the prior art memories is replaced by a single data input line, which occupies less space.

According to yet another advantage, the memory according to the invention makes it easy to implement a direct memory access (DMA) in the memory.

While there has been illustrated and described what are presently considered to be the preferred embodiments of the present invention, it will be understood by those of ordinary skill in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An integrated circuit serial access type memory, comprising:
   a data input;
   a data output;
   a memory plane organized in memory words;
   a set of column registers, one such column register being associated with at least one memory word of the memory; and
   first means operative, during an operation for writing a binary word in a given memory word, for loading the binary data of said binary word received in series at the data input directly into respective storage and switching latches of the column register associated with said memory word.

2. The integrated circuit serial access type memory according to claim 1, further comprising second means operative, during an operation for reading a binary word in a memory word, for reading successively the binary data stored in the memory cells of the memory word and for delivering directly, in serial form, each binary data read to the data output of the memory.

3. The integrated circuit serial access type memory according to claim 2, wherein the storage and switching latches leach comprise high-voltage storage means for storing a binary data in the form of one of a high programming voltage and a zero voltage, coupled to conditional switching means to bring to a high programming voltage a given bit line during a write operation, as well as loading means for loading a binary data into the high-voltage storage means.

4. The integrated circuit serial access type memory according to claim 3, wherein said first and second means comprise means for applying latch selection signals to the loading means of the storage and switching latches of each column register, as well as means for loading data into the latches, which act via register selection means such that they are common to all the latches of a given column register.

5. The integrated circuit serial access type memory according to claim 1, wherein the integrated circuit serial access type memory comprises at least one of EEPROM technology and EPROM Flash technology.

6. The integrated circuit serial access type memory according to claim 1, wherein the storage and switching latches each comprise high-voltage storage means for storing a binary data in the form of one of a high programming voltage and a zero voltage, coupled to conditional switching means to bring to a high programming voltage a given bit line during a write operation, as well as loading means for loading a binary data into the high-voltage storage means.

7. The integrated circuit serial access type memory according to claim 6, wherein said first and second means comprise means for applying latch selection signals to the loading means of the storage and switching latches of each column register, as well as means for loading data into the latches, which act via register selection means such that they are common to all the latches of a given column register.

8. The integrated circuit serial access type memory according to claim 7, wherein the means for loading data into the latches are common to all the column registers of the memory.

9. The integrated circuit serial access type memory according to claim 2, wherein the second means comprises a single readout line connecting the set of column registers to a readout circuit.

10. The integrated circuit serial access type memory according to claim 9, wherein the integrated circuit serial access type memory comprises one and only one data output line connecting the output of the readout circuit to the data output of the memory directly through an output buffer circuit.

11. The integrated circuit serial access type memory according to claim 9, wherein the readout circuit comprises one and only one readout amplifier, for detecting a current flowing on the readout line.

12. The integrated circuit serial access type memory according to claim 11, wherein the integrated circuit serial access type memory comprises one and only one data output line connecting the output of the readout circuit to the data output of the memory directly through an output buffer circuit.

13. The integrated circuit serial access type memory according to claim 1, wherein the first means comprises one and only one data input line connecting the data input to the set of column registers directly through an input buffer circuit.

14. An integrated circuit memory comprising:
   a data input;
   a data output;
   a memory plane organized in memory words;
   a set of column registers, one such column register being associated with at least one memory word of the memory;
   first means operative, during an operation for writing a binary word in a given memory word, for loading the binary data of said binary word received in series at the data input directly into respective storage and switching latches of the column register associated with said memory word; and
   second means operative, during an operation for reading a binary word in a memory word, for reading successively the binary data stored in the memory cells of the memory word and for delivering directly, in serial form, each binary data read to the data output of the memory, and wherein the integrated circuit memory comprises at least one of EEPROM technology and EPROM Flash technology.

15. The integrated circuit memory of claim 14, wherein the storage and switching latches each comprise high-voltage storage means for storing a binary data in the form of one of a high programming voltage and a zero voltage, coupled to conditional switching means to bring to a high programming voltage a given bit line during a write operation, as well as loading means for loading a binary data into the high-voltage storage means.

16. The integrated circuit memory of claim 15, wherein said first and second means comprise means for applying latch selection signals to the loading means of the storage and switching latches of each column register, as well as means for loading data into the latches, which act via register selection means such that they are common to all the latches of a given column register.

17. The integrated circuit memory of claim 16, wherein the means for loading data into the latches are common to all the column registers of the memory.

18. The integrated circuit memory of claim 14, wherein the second means comprises a single readout line connecting the set of column registers to a readout circuit.

19. The integrated circuit memory of claim 18, wherein the integrated circuit memory comprises one and only one data output line connecting the output of the readout circuit to the data output of the memory directly through an output buffer circuit.

* * * * *